United States Patent [19]

Amann et al.

[11] Patent Number: 4,792,200
[45] Date of Patent: Dec. 20, 1988

[54] ARRAY OF COUPLED OPTICAL WAVEGUIDES

[75] Inventors: Markus-Christian Amann, Munich; Bernhard Stegmueller, Augsburg; Franz Kappeler, Puchheim, all of Fed. Rep. of Germany

[73] Assignee: Siemens Aktiengesellschaft, Berlin and Munich, Fed. Rep. of Germany

[21] Appl. No.: 32,599

[22] Filed: Apr. 1, 1987

[30] Foreign Application Priority Data

Apr. 3, 1986 [DE] Fed. Rep. of Germany ....... 3611167

[51] Int. Cl.$^4$ .............................................. G02B 6/12
[52] U.S. Cl. .............................. 350/96.12; 350/96.14; 350/96.15; 372/43
[58] Field of Search ............... 350/96.11, 96.12, 96.14, 350/96.15; 372/6, 43–50

[56] References Cited

U.S. PATENT DOCUMENTS

| 3,868,589 | 2/1975 | Wang | 350/96.12 X |
| 4,318,058 | 3/1982 | Mito et al. | 350/96.11 X |
| 4,669,815 | 6/1987 | Thaniyavarn | 350/96.11 X |
| 4,669,816 | 6/1987 | Thompson | 350/96.15 |

OTHER PUBLICATIONS

Publication "Phase-locking Characteristics of Coupled Ridge-Wageguide InP/InGaAsP Diode Lasers", E. Kapon et al., 8-27-84, pp. 1159–1161, *Appl. Phys. Lett.*, vol. 45, No. 11.

Publication "Single Longitudinal Mode Operation of High Power Multiple-Stripe Injection Laser", D. E. Ackley, Nov. 3, 1982, pp. 152–154, *Appl. Phys. Lett.*, vol. 42, No. 2.

Publication "High Power Coupled Ridge Waveguide Semiconductor Laser Arrays", Tihjye Twu et al., Jul. 5, 1984, pp. 709–711, *Appl. Phys, Lett.*, Vol. 45, No. 7.

*Primary Examiner*—John D. Lee
*Assistant Examiner*—Phan Heartney
*Attorney, Agent, or Firm*—Hill, Van Santen, Steadman & Simpson

[57] ABSTRACT

An array of coupled waveguides in the form of MCRW laser diodes and/or passive waveguides are coupled to one another by optical waves of the TM-mode occurring in semiconductor regions between the waveguides that have a reduced thickness d, the neighboring waveguides being provided at a spacing a.

11 Claims, 1 Drawing Sheet

ARRAY OF COUPLED OPTICAL WAVEGUIDES

BACKGROUND OF THE INVENTION

1. Field of the Invention

The present invention relates generally to an array of optical waveguides and/or laser diodes in a semiconductor body.

2. Description of the Related Art

Laser diodes, also known as semiconductor lasers, are known. A laser diode can be used to emit a high intensity, highly focused laser emission. However, the light power per area of the laser diode emission is limited, particularly when additional requirements are made of the generated laser emission. One such requirement, resulting in the limitation of the output power for a laser diode, is when the emission is required to be, for example, a monomode emission.

It is possible to achieve higher light powers when a plurality of identical laser diodes are operated in parallel with their laser emissions geometrically optically combined. For instance, parallel operation is known in laser diode arrays. When laser diode arrays are used specifically for communication transmissions, it is important that all of the individual laser diodes meet the aforementioned requirement and emit the laser emission at the same frequency and in the same emission mode, and preferably of a uniform phase.

It has long been known to provide a plurality of laser diodes each having a laser-active strip integrated into a single semiconductor body or monolith. The individual strips of the laser diodes are disposed in close proximity and parallel to one another. It is also known to achieve the monomode emission and phase identity of the laser signal emitted from adjacent diode strips by arranging the laser diode strips close enough to one another that lateral coupling occurs between the individual laser beams. In other words, the laser emissions of respective neighboring laser strips are waveoptical coupled.

It is desired to have laser diodes with a threshold current for laser-active operation, that is, as low as possible. Low threshold currents are achieved when there is good lateral wave-guidance of the laser emission generated within the strip structure of the laser diode. Good lateral wave-guidance, and low threshold currents, are present in index-guided laser diodes as disclosed in U.S. Pat. No. 4,352,187 and as described in the publication "Frequenz", vol. 34 (1980) pages 343–346.

The desirable low threshold current, however, opposes an efficient coupling of neighboring laser strips, since the active regions of respective laser diode strips projects only slightly laterally beyond the actual strip region. In other words, the overlap of the active regions of adjacent laser diode strips is only small and, therefore, not very effective. To nevertheless achieve an adequate optical coupling, a very small spacing between neighboring laser diode strips is required. Since this, however, brings rise to substantial technical difficulties, it is preferred to use an oxide strip laser operating on the principle of a gain-guided laser which has significantly weaker lateral wave-guidance so as to guarantee good coupling between neighboring strips.

SUMMARY OF THE INVENTION

An object of the present invention is to provide an array which is technically simple to manufacture and which has optical waveguides and/or laser diodes that are optimally coupled to one another.

This and other objects are achieved in an array according to the principles of the present invention, including coupled optical waveguides that are spaced sufficiently apart so that leakage waves of a TM-mode occur laterally of the waveguides and between neighboring ones of the waveguides to provide an optical coupling therebetween. The waveguides of one embodiment are metal clad ridge waveguides (MCRW), and the TM-mode waves occur in the reduced thickness regions laterally of the ridge-shaped waveguides.

For purposes of the present invention, the comments regarding laser diode arrays apply equally to arrays of coupled waveguides in the form of passive opto-electronic components, such as, a star coupler, or star connection. Such passive components can also be of a type used to modulate a laser emission. The present invention is equally applicable to both active and passive components and, therefore, corresponding active and passive denoting terms apply interchangeably. For instance, the terms laser diode and laser strip are deemed also to cover the passive components of an optical waveguide and a waveguide strip. Similarly, laser-active layers also describe wave-conductive layers, and laser ridges include waveguide ridges, and the like.

Fundamentally, the present invention is based on two developmental directions having an anticipated result in and of itself from which no usable combination solution can be expected. In particular, the principle of index-guided waveguides which have only slight lateral coupling, on the one hand, is utilized in the present invention. Secondly, a relatively greater spacing between neighboring waveguides is provided so that the manufacture thereof is technically simpler. The anticipated result of these two developments to a person of skill in the art is that the stated object cannot be achieved with a combination according to these measures.

For the present invention, waveguides in the form of laser diodes are utilized which are based on the principles set forth in U.S. Pat. No. 4,352,187 and in the publication entitled "Frequenz". In other words, MCRW lasers are used.

The stated object of the present invention is achieved in an array wherein the thickness of an intervening region lying between two neighboring waveguide strips is of particular importance. The range of optimum thickness values for the intervening region has been found to be dependent on the wavelength of the laser emission generated in the semiconductor material. Thus, a suitable thickness value for one semiconductor material compared to a suitable thickness value for another semiconductor material relate to one another as a ratio of the wavelength of the laser emissions in the one material compared t that in the other material. For example, semiconductor materials having a relatively long wavelength emission enable relatively larger thickness values of the intervening region to be used. For instance, InP has longer wavelength than GaAs semiconductor material and, thus, the intervening region of the former would be thicker than in the latter. For a passive component, tee determining factor is the relative wavelength of the laser radiation radiated into the component. The aforementioned thickness value is that of the residual layer of the semiconductor heterostructure format layer which is left above the laser-active layer in the intervening region between two neighboring waveguide strips.

In the aforementioned U.S. Pat. No. 4,352,187, the disclosed laser diode has a semiconductor layer of the double heterostructure format which lies between the actual laseractive layer and the metal strip contact and is of a reduced thickness laterally of the laser ride. As disclosed in this patent and in the publication "Frequenz", the wave guidance index of the MCRW laser diode derives as a result of an elongated ridge shape formed by the reduction at the lateral regions.

In accordance with the present invention, however, the reduction in the semiconductor layer is so great, and the remaining thickness of the layer in the region laterally of the waveguide web extending between the waveguide strips is so slight that a phenomenon occurs which cannot occur given the thickness of the layer hitherto selected in the regions laterally of the known waveguide ridges. In particular, the phenomena that occurs is the presence of "leakage" waves in the region between two neighboring waveguide strips. The "leakage" wave form as the result of the dimensions of the intervening remaining layer thickness in the regions adjacent the waveguide strips. The leakage waves have a wave number that is greater than that of the wave guided in the region of the waveguide ridge, which, for example, is the laser emission generated in the region of the laser ridge.

An additional condition for the creation of the leakage waves is that a metal covering is present on the semiconductor surface in the region in which the leakage waves are formed, i.e., laterally and between the respective waveguide ridges. The metal covering is coextensive with and of the same type as the metal layer typically provided on the ridge of an MCRW laser.

It has been found that the leakage waves occur in a Tm mode, in contrast to the TE mode which is ordinarily present in the generated laser emission or the transmitted laser emission in a passive component. In the present invention, the TM-mode leakage waves are the coupling element that couples the TE waves of the laser emission.

The waveguides of the present invention are spaced from one another and are of such size that, based on the disclosures of the prior art, no usable coupling should actually be anticipated, although with the measures set forth herein an optical coupling does occur. The spacing of the waveguides of the present invention offers a technological advantage, since the waveguides need not be as closely spaced as required in the prior art while still providing coupling.

DESCRIPTION OF THE PREFERRED EMBODIMENTS

Figure 1:
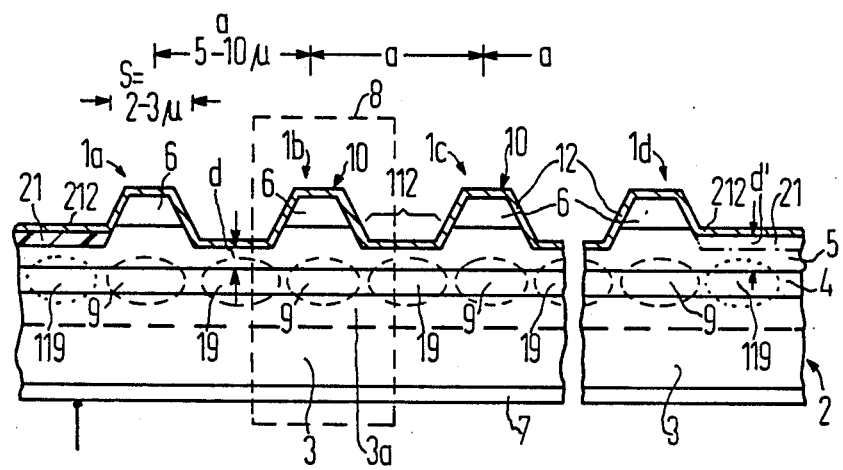
FIG. 1 is an elevational end view of a semiconductor waveguide array according to the principles of the present invention.

In FIG. 1, an end view of an array of laser diodes $1a$, $1b$, $1c$, and $1d$ is shown, the laser diodes $1a$–$1d$ being optically coupled to one another. Although such an array usually includes a greater number of individual laser diodes $1a$–$1d$, for example, from 2 to as many as 40, only four laser diodes $1a$–$1d$ are shown herein for purposes of simplicity.

The laser diodes $1a$–$1d$ are formed by integrated portions of a semiconductor body 2, which preferably includes a double hetero-layer structure format. A portion 3 of the semiconductor body 2 is, in the preferred embodiment, a substrate. In the illustrated embodiment, the substrate 3 includes a first layer $3a$ disposed thereover. The substrate 3 is, for example, indium phosphide or gallium arsenide, and the layer $3a$ is, for example, indium phosphide or gallium aluminum arsenide, respectively. A usually extremely thin layer 4 forms the actual laser-active layer on the substrate portion 3. When the substrate portion 3 is of indium phosphide, the layer 4 is preferably composed of indium gallium arsenide phosphide or, respectively, when the substrate portion 3 is of gallium arsenide, the layer 4 is likewise composed of gallium arsenide. A layer 5 which is of, for example, indium phosphide or gallium aluminum arsenide, respectively, is disposed on the laser-active layer 4. Further portions 6 may also be provided on the layer 5 which were originally part of a surface-wide layer, but has been formed into ridges in accordance with the known strip lasers having elongated laser ridges. The portions 6 serve to form an ohmic contact, or reduced electrical lead resistance, for an electrical connection. An electrical terminal 7 is provided on a lower surface of the substrate, as well.

In FIG. 1, a portion outlined by a broken line boundary 8 corresponds to the structure of an individual MCRW laser diode as disclosed in U.S. Pat. No. 4,352,187. The laser diode within the boundary 8 generates a laser emission in a zone 9 of the laser-active layer 4. Due to the format of the layers 3, 4, and 5 of the semiconductor body 2, and due to a thickness d laterally of the laser diode ridge for MCRW laser diodes the diode exhibits good index guidance. As a consequence of the diminished thickness of the layer 5 to the dimension value d provided laterally of a laser ridge 10, the ridge shape of the individual laser diodes $1a$, $1b$, $1c$, and $1d$ is formed.

A metal layer 12 is provided on the surface of the semiconductor body 2. A portion of the metal layer 12 extends over the portion 6 of the semiconductor body to form the actual electrode for the respective laser diodes $1a$, $1b$, $1c$, and $1d$, for which the substrate terminal 7 is the cooperating electrode. The current flux between the electrode portion of the layer 12 and the substrate terminal 7 is the diode current of the individual laser diodes $1a$, $1b$, $1c$, and $1d$.

However, a portion 112 of the layer 12 is also of significance for the present invention. The portion 112 extends over the surface of the layer 5 laterally of the actual ridge, or ridge, 10 in the region of the diminished thickness d, the thickness d being selected in accordance with the present invention. The lateral portions 112 of the metal layer 12, along with the inventively selected thickness d enable important leakage waves to be created.

In the illustrated embodiment, the individual laser diodes $1a$, $1b$, $1c$, and $1d$ are arranged lying side-by-side and parallel to one another. A center-to-center spacing a between respective neighboring individual laser diodes $1a$–$1d$ is selected of such size in an array of the present invention that no optical wave coupling of a type known for an array with phase-locked monomode emissions of coupled lasers should occur. The statement that no optical wave coupling occurs refers to that is known for the design and function of the known MCRW laser diodes.

In the present invention, however, the thickness dimension d is so small that the leakage waves in a TM-mode appear in regions 19. The regions 19 extend parallel to the laser-active zones 9 and through the semiconductor body 2. The leakage waves provide the optical wave coupling elements between the TE waves of the laser-active zones 9 in the laser diodes 1a–1d. The thickness dimension d is to be smaller than is provided for a known MCRW laser.

In one example, the semiconductor body 2 is of indium phosphide/indium gallium arsenide phosphide/indium phosphide having a wavelength (in air) of 1300 nm for the laser emission generated in the laser-active zones 9. The remaining thickness dimension d for the example is from 0.05 through 0.3 $\mu$m and, preferably, is 0.15 $\mu$m. The center-to-center spacing a for the example is from 5 through 10 $\mu$m. In a second example, the semiconductor body is of gallium arsenide/gallium aluminum arsenide/gallium arsenide and produces a laser emission (in air) having a wavelength of 0.8 $\mu$m, the thickness d is in the range of 0.05 through 0.2 $\mu$m, and preferably, 0.1 $\mu$m; the dimension a for such embodiment being from 3 through 8 $\mu$m.

A further development of the present invention is also shown in FIG. 1, and includes strip-shaped layers 21 of dielectric material, such as, for example, $Al_2O_3$. The strips 21 extend parallel to the longitudinal extent of the laser webs, or ridges, 10 and perpendicular to the plane of the drawing in FIG. 1. The strips 21 are at the respective outsides of the outermost laser ridges, which in the illustrated embodiment are the laser diodes 1a and 1d. The laser strips 21 ensure that a portion 212 of the metal layer 12 lying over the layer strips 21 do not form any direct electrical contact with the layer 5. In an MCRW laser diode, this causes the two outwardly situated laser active zones to have a lower guidance index, or optical wave guidance, toward the outside and away from the middle of the array. This causes a TM wave which is at most extremely weak to be generated in regions 119 which are bounded by a dotted outline in FIG. 1. Thus, emission losses are reduced in the lateral direction of the array.

Figure 2:
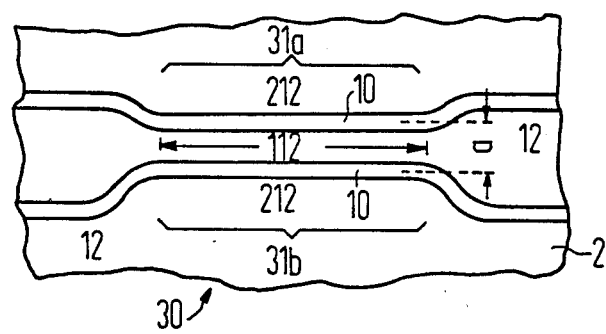
FIG. 2 is a plan view of a passive waveguide component of the present invention.

In FIG. 2, a plan view of a wave coupler 30 of the invention is shown including coupled waveguides 31a and 31b. Due to their mutual spacing, the portions situated preceding and following the coupled waveguides 31a and 31b are not coupled to one another. The wave coupler of FIG. 2 provides an advantage in that it is simpler to manufacture due to the comparatively large spacing a therebetween, which nevertheless optically couples the two waveguides 31a and 31b. The structure of the wave coupler 30 corresponds in principle to the structure of FIG. 1 in that a thickness d is provided in the region between the coupled waveguides 31a and 31b. A metal layer 112 is likewise provided between the waveguides 31a and 31b.

Just as in the embodiment of FIG. 1, a layer strip 21 can also be provided lying between the semiconductor 2 and the metal layer 12 and laterally of the coupling region of the waveguides, such region having the spacing a and the metal layer 122 in the embodiment of FIG. 2. The layer strip 21 reduces the occurrence of TM waves occurring therein at regions outside of the array and, thus, reduces emission losses connected therewith.

Embodiments of the invention described above preferably include a layer strip 21 extending laterally outward along the outermost one of the waveguides 1a, 1d, ; or respectively, 31a and 31b at both sides of the array in the region 212 and between the metal layer 12 and the semiconductor body 2. The layer strips 21 at both sides further reduce or prevent the creation of the TM-mode waves and lateral emissions outside of the array. Instead of providing the additional layer strips 21, however, an alternate embodiment does reduce the layer 5 laterally of the array to the reduced thickness d which is disclosed for the regions between the neighboring waveguides 1a–1d and in the region between the waveguides 31a and 31b. In the alternate embodiment, the layer 5 has a greater layer thickness d' provided where the layer strips 21 are provided in the previous embodiments. The layer thickness d' is at least thicker than the layer thickness d, and is, in a preferred embodiment, approximately the usual layer thickness found in MCRW laser diodes. As shown in broken lines on the right-hand side of FIG. 1, the layer portion 21 could then be omitted, the thickness d' being equal to the sum of the thickness d and the thickness of the layer strip 21 in the previous embodiments, although this need not always be the case.

In the embodiment of FIG. 2 showing the coupled waveguides 30, everywhere outside of the coupling region covered by the metal layer 112 can have a thickness dimension of d' and, thus, not be reduced to the lesser thickness d. In other words, only the region between the waveguides 31a and 31b, where the waveguides are spaced by the interval a and where the wave coupling of the invention is present due to the TM-mode, is provided at a reduced thickness d.

Although other modifications and changes may be suggested by those skilled in the art, it is the intention of the inventors to embody within the patent warranted hereon all changes and modifications as reasonably and properly come within the scope of their contribution to the art.

We claim as our invention:

1. An improved array of coupled metal clad ridge waveguide lasers on a semiconductor body having a plurality of individual ridge-shaped waveguides located adjacent to and laterally spaced from one another, a second semiconductor layer of said semiconductor body being provided above a first laser active waveguide layer, the improvement comprising:

a continuous metal cladding layer extending above and in contact with portions forming upper portions of said ridge-shaped waveguides, said portions forming ohmic contacts with said metal cladding layer;

said second semiconductor layer having zones that are free of said portions forming upper portions of said ridge-shaped waveguides, said zones being of reduced thickness laterally of and between two neighboring ones of said waveguides, said metal cladding layer extending above said zones of said second semiconductor layer;

said neighboring waveguides being spaced apart so that leakage waves of TM wave-mode occur in said reduced thickness semiconductor layer to optically couple said neighboring waveguides by TM-mode waves.

2. An improved array as claimed in claim 1, further comprising:

a layer of dielectric material extending laterally of an outermost one of said waveguides in said array, said dielectric layer extending outwardly from said array on a surface of said semiconductor body.

3. An array of coupled metal clad ridge waveguide lasers, comprising:

a semiconductor body including a plurality of layers, said plurality of layers including an optically transmissive laser-active first layer and a second semiconductor layer located above said laser-active first layer; and a plurality of substantially parallel metal clad ridge waveguide lasers formed in said semiconductor body for conducting TE mode waves, said metal clad ridge waveguide lasers including individual ridge-shaped waveguides, said ridge-shaped waveguides include portions forming upper portions of said ridge-shaped waveguides and ohmic contacts, regions between said ridge-shaped waveguides being free of said portions forming upper portions of said waveguides and having a reduced thickness sufficient to cause TM-type leakage waves laterally of said ridge-shaped waveguides to optically couple neighboring ones of said waveguides, said neighboring waveguides being spaced from one another a predetermined distance, and a continuous metal cladding layer extending above and in contact with said portions forming upper portions of said ridge-shaped waveguides, said metal cladding layer forming ohmic contacts with said upper portions, said continuous metal cladding layer extending above said regions between said waveguides.

4. An array as claimed in claim 3, wherein said semiconductor body is of indium phosphide/indium gallium arsenide phosphide/indium phosphide for producing a laser emission in air of approximately 1300 nm, said predetermined distance between said parallel waveguides being in the range of 5 through 10 μm, and said area of reduced thickness having a thickness above said optically transmissive layer in the range of 0.05 through 0.3 μm.

5. An array as claimed in claim 3, wherein said semiconductor body is of gallium arsenide/gallium aluminum arsenide/gallium arsenide to produce a laser emission in air of approximately 0.8 μm, said predetermined distance between said parallel waveguides being in the range of 3 through 8 μm, and said area of reduced thickness having a thickness above said optically transmissive layer in the range of 0.05 through 0.2 μm.

6. An array as claimed in claim 3, further comprising:

a strip-shaped layer of dielectric material extending adjacent an outermost one of said plurality of substantially parallel waveguides and at an outside of said array.

7. An array as claimed in claim 6, wherein said strip-shaped layer is disposed over said semiconductor body, and further comprising: a metal layer over said strip-shaped layer.

8. An array as claimed in claim 7, wherein said strip-shaped layer is of $Al_2O_3$.

9. An array as claimed in claim 3, wherein one of said layers of said semiconductor body is disposed over said optically transmissive layer and is of a reduced first thickness laterally of said waveguides to define said waveguides, said one layer being reduced to a second thickness in regions between neighboring ones of said plurality of parallel waveguides, said second thickness being less than said first thickness.

10. An array as claimed in claim 9, wherein said waveguides are laser diodes.

11. An array as claimed in claim 9, wherein said waveguides are passive waveguides.

* * * * *